United States Patent [19]
Carey et al.

[11] Patent Number: 5,284,548
[45] Date of Patent: Feb. 8, 1994

[54] PROCESS FOR PRODUCING ELECTRICAL CIRCUITS WITH PRECISION SURFACE FEATURES

[75] Inventors: David H. Carey, Austin, Tex.; David J. Burger, St. Paul, Minn.

[73] Assignees: Microelectronics and Computer Technology Corporation, Austin, Tex.; Minnesota Mining and Manufacturing Company, St. Paul, Minn.

[21] Appl. No.: 25,550

[22] Filed: Mar. 3, 1993

[51] Int. Cl.$^5$ .............. B44C 1/22; C23F 1/00
[52] U.S. Cl. .................. 156/630; 156/634; 156/645; 156/656; 156/659.1; 156/902
[58] Field of Search ............ 156/630, 631, 632, 634, 156/645, 656, 659.1, 666, 902, 643, 150, 151; 29/846, 852; 205/118, 125; 430/312, 314, 315, 318; 427/97, 98; 174/259, 266; 428/137, 209, 901

[56] References Cited

U.S. PATENT DOCUMENTS

| | | | |
|---|---|---|---|
| 4,735,676 | 4/1988 | Iwasa | 156/630 |
| 5,158,645 | 10/1992 | Covert et al. | 156/645 |
| 5,196,087 | 3/1993 | Kerns | 156/902 X |

*Primary Examiner*—William Powell
*Attorney, Agent, or Firm*—David M. Sigmond

[57] ABSTRACT

A process for producing fine pitch surface features on a multilayer printed circuit boards such as copper-polyimide interconnects without requiring a thick copper plating foil. Initially, a thin first conductor (less than 1 micron) is vacuum deposited on a dielectric base and the dielectric base is disposed on a substrate. The substrate is then laminated and through-holes are formed therethrough. A plating seed is deposited in the through-holes and resist is patterned on the first conductor. A second conductor is deposited on the exposed portions of the first conductor and on the sidewalls, the resist is stripped and the portions or the first conductor beneath the resist are removed using a brief wet chemical etch to form spaced features without significant undercut. In the preferred embodiment, vacuum deposition occurs in a continuous roll sputtering system.

41 Claims, 6 Drawing Sheets

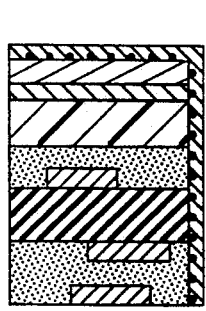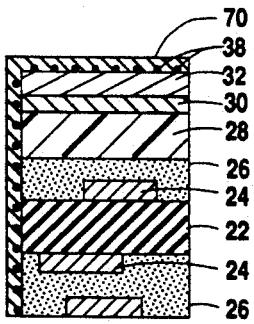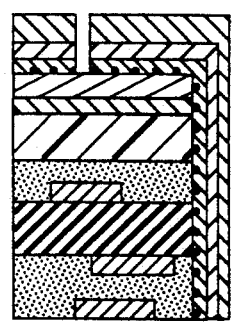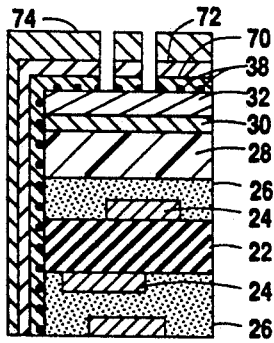
Fig. 26        Fig. 30
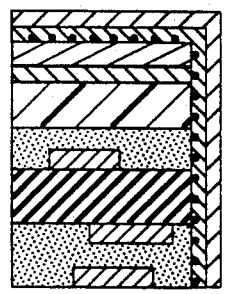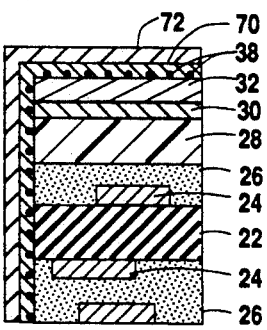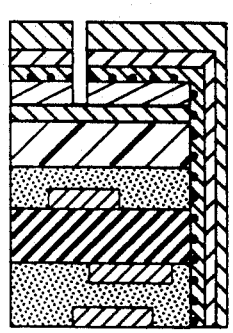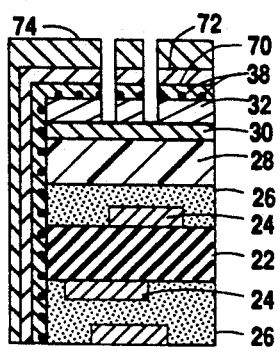
Fig. 27        Fig. 31
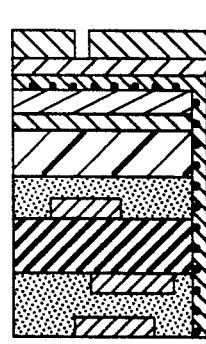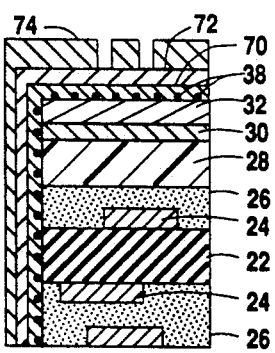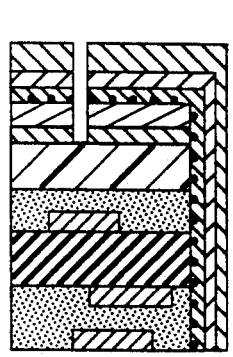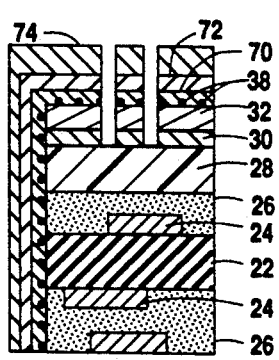
Fig. 28        Fig. 32
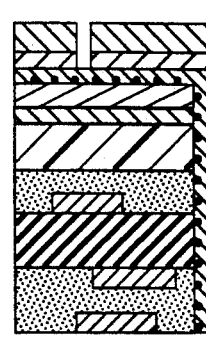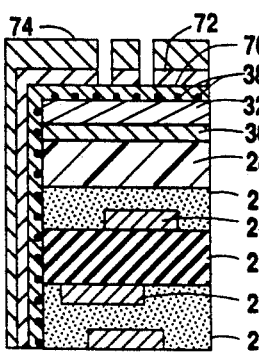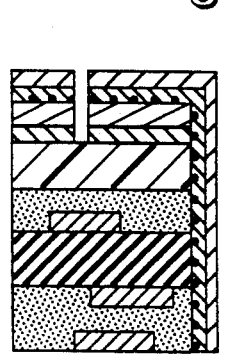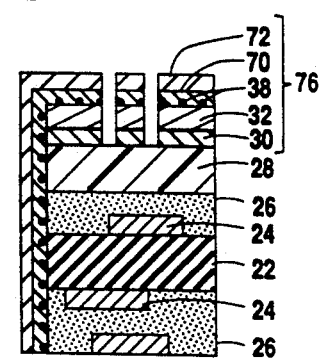
Fig. 29        Fig. 33

PROCESS FOR PRODUCING ELECTRICAL CIRCUITS WITH PRECISION SURFACE FEATURES

BACKGROUND OF THE INVENTION

1. Field of the Invention

The invention relates to a process for producing electrical circuits, and more particularly to a lamination process for producing multilayer printed circuit boards with fine pitch surface features.

2. Description of the Related Art

Current multi-chip circuitry requires the attachment of numerous integrated circuit chips to multilayer substrates or boards such as copper-polymide interconnects. The chips are attached to surface mount pads located on the top surface of the substrate. In order to increase the number of chips in a given area, it is important to decrease the pitch of the surface features including the traces and the pads.

Conventional processes for producing multilayer printed circuits employ copper foils for plating bases which are usually at least 5 microns thick. The copper foil is laminated to a substrate and then through-holes are drilled in the substrate. Next, spaced surface features are formed on the foil either additively or subtractively.

In the additive process photoresist is applied and developed on the copper foil. Metal is plated on the exposed portions of the copper foil. The remaining resist is stripped and the underlaying copper foil is removed.

In the subtractive process metal is first plated on the exposed copper and then the resist is patterned on the metal. The exposed metal is removed as is the underlaying copper. Finally, the resist is stripped.

Fine pitch features (less than approximately 6 mil pitch) are difficult to realize, however, with conventional additive and subtractive foil-based printed circuit board fabrication techniques due to feature undercut during etchback. Undercut results from the tendency of wet chemical etchants to etch laterally as well as vertically. The undercut may cause significant amounts of material to be lost, producing deformed features with poor mechanical and/or electrical characteristics.

Several solutions to the copper foil undercutting problem have been proposed. These solutions are usually based on the theme that as the copper foil or film gets thinner, the needed exposure to wet chemical etching and subsequent undercut are reduced. For example, U.S. Pat. Nos. 4,431,710 and 4,499,152 disclose laminates with thin copper films (less than about 16 microns thick). These copper films are vapor deposited on aluminum carrier sheets, a bonding layer is adhesively situated between the copper film and a substrate, and the carrier sheet is peeled away from the copper film. A drawback to this technique is the need for providing and peeling away the carrier sheet. Likewise, U.S. Pat. Nos. 4,705,592 and 4,521,280 reduce undercutting during etching by replacing the traditional copper foil with a thin conductive layer (about 80 to 500 nanometers thick) which is sputtered onto a roughened top surface and into through-holes of a substrate in a single step. While this produces a thin plating layer and may reduce costs by eliminating the need for depositing a plating seed in the through-holes, it is still relatively expensive since the sputtering must be performed on a small surface after lamination has occurred. Furthermore, pre-catalyzed substrates are known in the art.

SUMMARY OF THE INVENTION

The present invention provides a cost-effective lamination process for producing precision surface features for external bonding surfaces on multilayer printed circuit boards without using thick outer layers of copper foil which suffer from significant undercut due to wet chemical etchants. The present invention employs a very thin (less 1 one micron thick) pre-lamination vacuum deposited film as a plating interconnect for pattern plated surface features so that interconnect etchback is brief enough to avoid significant undercut. This allows precisely defined, fine pitch surface features (less than 6 mil pitch) to be realized in a relatively standard printed circuit board fabrication sequence. Furthermore, improved feature adhesion and resistance to rigorous assembly processes allow for higher glass transition temperatures ($T_g$) of the underlying polymer films.

A primary object of the present invention is to reduce feature etchback (geometry loss) of pattern plated surface features in multilayer boards such as printed circuit boards and multi-chip modules.

In accordance with one feature of the present invention, there is provided a process for producing electrical circuits which includes providing a substrate containing a patterned conductor, a dielectric, and a reflowable adhesive, vacuum depositing a first conductor on a dielectric base, disposing the dielectric base on the substrate, laminating the substrate with the first conductor thereon so as to reflow the adhesive, forming a through-hole in the top surface of the substrate at least partially through the substrate, providing a plating seed on the sidewalls of the through-hole, depositing a conductive metal on the sidewalls, depositing a second conductor on the first conductor, and forming spaced features on the dielectric base wherein the spaced features comprise the first and second conductors and at least one spaced feature is electrically connected to the metal in the through-hole.

The vacuum deposition may be performed by evaporating, ion assisted evaporating, magnetron ion plating, ion enhanced plating, chemical vapor deposition, or sputtering.

The spaced features may be formed using wet chemical etching, mechanical etching such as vapor honing and sandblasting, and plasma flash etching.

In certain preferred embodiments, an adhesion metallic layer such as chrome or titanium is deposited on the dielectric base and the first conductor is sputtered less than one micron thick on the adhesion metal. After laminating the substrate, through-holes are formed and a plating seed for electroless plating such as palladium is deposited on the through-hole sidewalls to render the sidewalls catalytic to electroplating. A second conductor is plated on the first conductor and on the catalytic sidewalls by electroless deposition and a third conductor is plated on the second conductor by electrolytic deposition. Spaced features comprising the first, second and third conductors and the adhesion metal are formed, either additively or subtractively, using photolithography and wet chemical etching without significantly undercutting the features.

Advantages of the present invention include: the process steps are easily incorporated into existing technology; the adhesion and stability of the surface features are increased; the conductive film that the surface features are built on may be vacuum deposited using a large scale continuous roll system; and no sacrifical copper foils are utilized.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein:

FIGS. 26-33 are fragmentary elevational views in cross-section illustrating successive stages in conjunction with FIGS. 1-7 for fabricating precision surface features on a multilayer printed circuit board using a subtractive process with electroless plating and electrolytic plating in accordance with a fourth embodiment of the present invention.

DETAILED DESCRIPTION OF THE PREFERRED EMBODIMENTS

The present invention shall be described by way of four embodiments. The first embodiment includes an additive process with electroless plating, the second embodiment includes an additive process with electroless plating and electrolytic plating, the third embodiment includes a subtractive process with electroless plating, and the fourth embodiment includes a subtractive process with electroless plating and electrolytic plating.

Referring now to FIGS. 1-7, the process steps set forth are the initial steps for each of the embodiments herein. Therefore, for the sake of brevity FIGS. 1-7 shall be referred to by each of the following embodiments.

Figure 1:
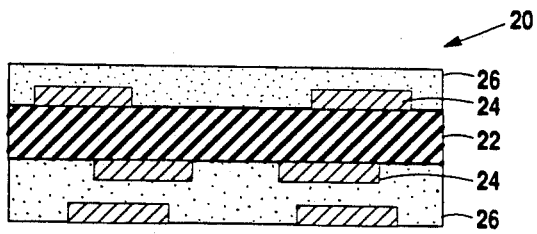
FIGS. 1-7 are fragmentary elevational views in cross-section illustrating the initial stages for partially fabricating precision surface features on a multilayer printed circuit board.

In FIG. 1, the reference numeral 20 generally indicates a substrate used to fabricate a multilayer printed circuit board with fine pitch surface features. Substrate 20 contains sequential stack of registered circuit layers. Each circuit layer contains a dielectric such as a polymer like polyimide 22 and a patterned metal conductor circuit shown as copper 24. A reflowable adhesive such as glue or prepreg 26 is positioned between and above the circuit layers. Prepreg 26 is used to reflow and solidify during a subsequent lamination step, described below.

Figure 2:
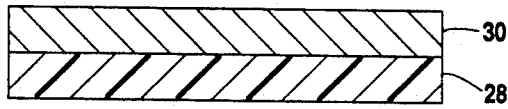

In FIG. 2, a dielectric base such as Kapton (TRADEMARK) polyimide film 28 is provided, and an adhesion metal shown as chrome adhesion layer 30 is deposited on the Kapton 28. Chrome 30 is preferably between 200-700 angstroms thick. Titanium is also a suitable adhesion is metal.

Figure 3:
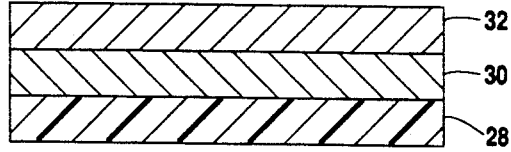

In FIG. 3, a first conductor plating base with a smooth top surface shown as copper 32 is vacuum deposited such as by sputtering on chrome layer 30. It is noted that copper 32 can be sputter deposited directly on the dielectric base and adhere to the base. However, inclusion of a separate adhesion layer to assure adequate adhesion is customary. While chrome or titanium provide good adhesion, neither provides a suitable plating base. Sputtering is the preferred vacuum deposition technique for the copper 32 plating base, although evaporation, ion assisted evaporation, magnetron ion plating, ion enhanced plating and chemical vapor deposition are all suitable alternatives and common techniques used to achieve thin layers of conductive materials. The vacuum deposited copper 32 must be thin enough to dissolve in a wet chemical etch without permitting significant lateral undercut; however, copper 32 must also be sufficiently thick to provide an electroplating base as will be further described below. This is best accomplished by making copper 32 less than approximately one micron thick, for instance in the range of 500-2500 angstroms thick. The present invention avoids fabricating copper 32 from copper foil since sub-micron thick copper foil is considered too fragile for practical purposes.

It is critical to note that the present invention vacuum deposits the first conductor *before* the lamination step. Furthermore, the dielectric base such as Kapton 28 may be a flexible, non-brittle material on the order of two mils thick which is easily wound into a role. This is in sharp contrast to a rigid laminated structure on the order of 20 mils thick which can not be conveniently wound into a roll. Accordingly, the present invention enables vacuum deposition to take place on the dielectric base as it is fed or unwound from a continuous roll of the dielectric base. This is highly advantageous from a manufacturing standpoint. In fact, the use of a continuous roll system to vacuum deposit the adhesion metal on the dielectric base and then the first conductor on the adhesion metal prior to lamination and through-hole formation is also preferred, with continuous roll sputtering most preferred. A continuous roll system takes advantage of economies of scale and minimizes the number of expensive lock down steps which might otherwise be required. Continuous roll vacuum deposition also eliminates the need for sacrificial copper layers since sufficient adhesion is obtained as a result of bombarding the substrate with the conducting material. Furthermore, the use of air locked rotable drums allows for the production of large amounts of vacuum deposited material at a low cost. The details of continuous roll vacuum deposition systems are known in the art and therefore are not set forth herein; see, for instance, U.S. Pat. No. 4,508,049 which is incorporated by reference.

Figure 4:
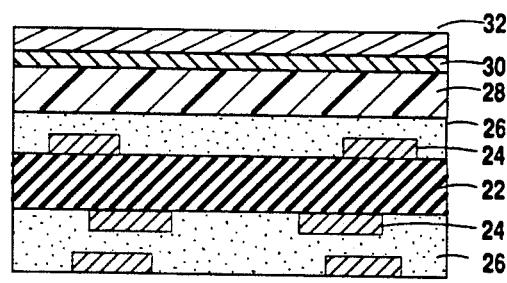

In FIG. 4, Kapton base 28 with chrome 30 and copper 32 thereon is disposed on the top prepreg layer 26 of substrate 20. It is noted, however, that while a reflowable adhesive is positioned between Kapton 28 and substrate 20, it need not necessarily reside initially on substrate 20. For instance, top prepreg layer 26 could be replaced by a reflowable adhesive layer attached to the side of Kapton base 28 opposite chrome 30 before disposing the base on the substrate.

Figure 5:
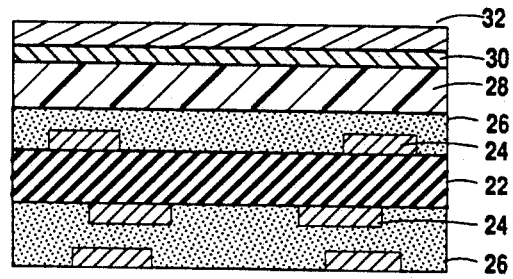

In FIG. 5, substrate 20 is laminated by applying heat and pressure to the top and bottom surfaces of substrate 20. This is normally accomplished by positioning the substrate between two pressure plates in a laminant oven. The heat and pressure cause the layers of prepreg 26 to melt and reflow. Thereafter, the substrate is cooled and the prepreg hardens. (The reflowed prepreg 26 is depicted with a darker shade.) The resulting laminated substrate 20 forms a continuous stack of circuit layers mechanically integral with one another and with Kapton 28, chrome 30 and copper 32.

Figure 6:
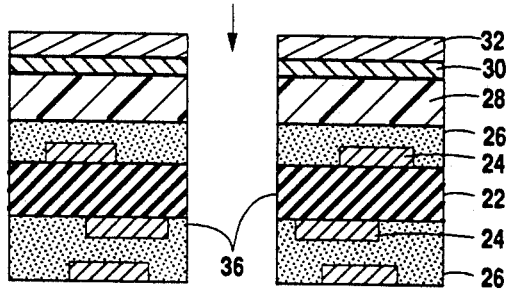

In FIG. 6, cylindrical through-holes 34 with inner walls or sidewalls 36 are formed by drilling or the like between the top and bottom surfaces of substrate 20 so as to allow subsequently deposited metal therein to interconnect conductors on various layers and surfaces. Usually a clean-up step follows to remove unwanted debris. For ease of illustration only a single through-hole is shown although in practice many through-holes would be formed. Moreover, although not shown, the through-holes need not necessarily extend completely through the substrate. Instead, the through-holes could be formed in the top surface but only extend partially through the substrate to form "blind vias."

Figure 7:
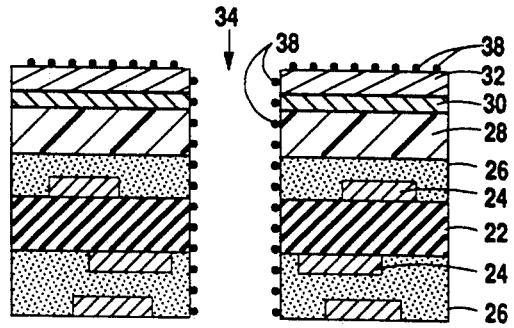

In FIG. 7, a plating seed for electroless plating such as palladium (or a palladium-bearing compound) shown as "dots" of palladium 38 is deposited on copper 32 and on the sidewalls 36. Since copper 32 is already catalytic for electroless plating it is unnecessary to deposit palladium 38 thereon, however, it is convenient to dip the entire substrate 20 in a solution containing the palladium. Non-catalytic sidewalls 36, however, are rendered catalytic. Sidewalls 36 tend to be rough due to the way the through-holes are formed, whereas the top of substrate 20 is smooth in order to support fine surface features. Plating seeds are generally much more effective on roughened surfaces than on smooth surfaces. As a result, palladium 38 is effective on sidewalls 36 but would not necessarily be effective on the smooth top dielectric surface of Kapton 28. Therefore, copper 32 must be provided on top of substrate 20 although it is not essential to provide copper 32 on sidwalls 36. Copper 32 not only provides a plating base for the top surface, but also is an effective surface for palladium 38 to deposit on. Depositing catalytic seeds for electroless plating is well known in the art, as disclosed in U.S. Pat. Nos. 4,770,899 and 4,701,351. Further catalyzation techniques are reported by Kathleen Nargi-Toth in "Metallization Trends for the 1990s", *Printed Circuit Fabrication*, Vol. 15, No. 9, September 1992, pp. 34-38 which is incorporated by reference. Alternatively, the use of a pre-catalyzed substrate provides catalytic sidewalls without the need for depositing a separate plating seed on the sidewalls after the through-holes are formed. Whatever the approach, sidewalls 36 must be rendered catalytic for subsequent electroplating.

First Embodiment

Referring now to FIGS. 8-12, there is shown a first embodiment of the present invention which forms the spaced features using an additive process with electroless plating.

In FIGS. 1-7, as previously described, adhesive chrome 30 is sputtered on Kapton 28, copper 32 is sputtered on chrome 30, Kapton 28 is disposed on substrate 20, substrate 20 is laminated, through-holes 34 are drilled in substrate 20, and palladium 38 renders through-hole sidewalls 36 catalytic.

Figure 8:
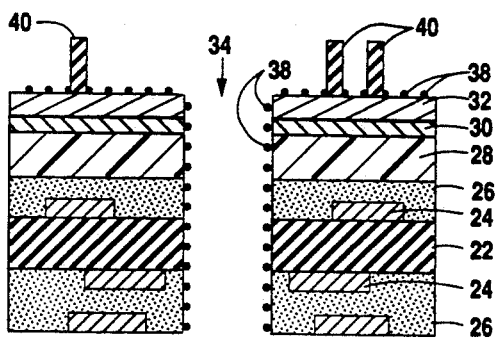
FIGS. 8-12 are fragmentary elevational views in cross-section illustrating successive stages in conjunction with FIGS. 1-7 for fabricating precision surface features on a multilayer printed circuit board using an additive process with electroless plating in accordance with a first embodiment of the present invention.

In FIG. 8, photoresist 40 is applied on copper 32. The resist is patterned by depositing and developing it, as is conventional. The openings formed in the photoresist leave portions of copper 32 and sidewalls 36 exposed.

Figure 9:
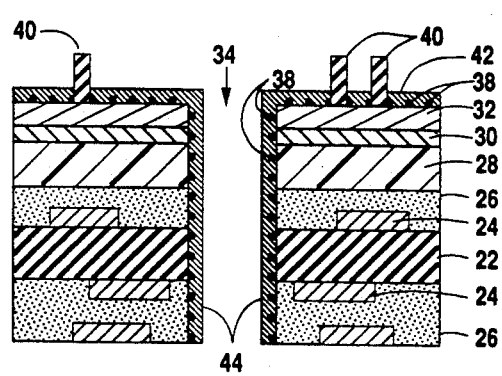

In FIG. 9, a second conductor seen as copper 42 is deposited to a minimum height of 5 microns by electroless plating on the exposed portions of copper 32 above Kapton 28 and on sidewalls 36 inside through-holes 34. The copper 42 inside through-holes 34 forms metallized conductive vertical vias 44.

Figure 10:
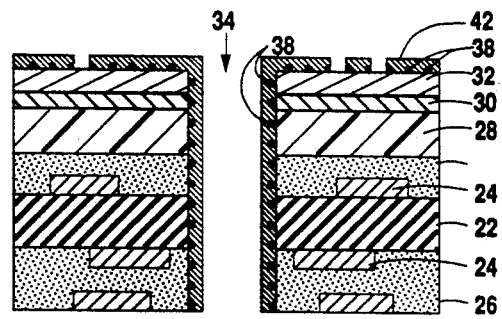

In FIG. 10, resist 40 is stripped in a wet chemical etching solution.

Figure 11:
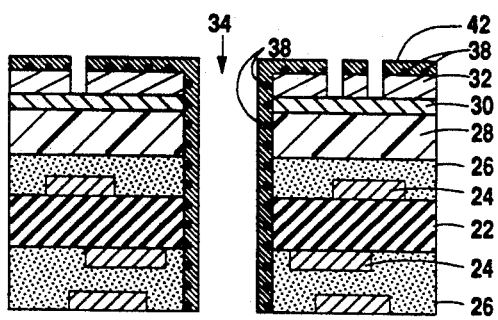

In FIG. 11, second portions of copper 32 (which were previously covered by resist 40 but never covered by copper 42) become exposed. These exposed second portions of copper 32 are then etched and removed. A wet chemical etching solution such as an ammoniacal etchant, ferric chloride, or cupric chloride may be applied as a spray directed vertically at the substrate. Since copper 32 is less than one micron thick, only a negligible amount (less than one micron) of undercut occurs on copper 42 and the underlying copper 32. Furthermore, since copper 32 is much thinner than copper 42, several non-selective etches can be used. Suitable mechanical etches include vapor honing a slurry mixture under high pressure and sandblasting. Likewise, a plasma flash etch can volatize a thin layer of copper 32 without appreciably effecting copper 42. The common requirement to all these etches is that upon completion or endpoint, copper 42 and the underlying copper 32 retain most or all of the original shape provided by resist 40.

Figure 12:
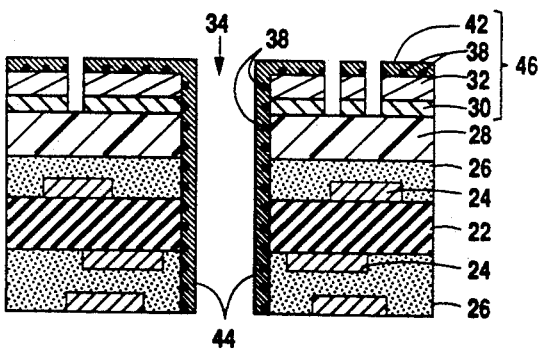

In FIG. 12, after the exposed second portions of copper 32 are etched, portions of chrome 30 become exposed and are also removed by wet chemical etching, preferably with an etchant that attacks chrome without appreciably effecting copper like potassium ferricyanide/potassium hydroxide, 10% hydrochloric acid, or sodium oxide in sulfuric acid. As a result, a predetermined pattern of spaced surface features 46, comprise patterned copper 42, copper 32 and chrome 30 residing on Kapton 28. Features 46 form conventional metallic surface structures such as bonding pads and traces or lines connected to the pads. In addition, features 46 are electrically connected to the conductive metal vias 44 in through-holes 34. Conductive vias 44 act to electrically interconnect selected features 46 to selected circuits 24 as well as selected circuits 16 to other selected circuits 24.

Second Embodiment

Referring now to FIGS. 1-7 and 13-19, there is shown a second embodiment of the present invention which forms the spaced features using an additive process with electroless plating and electrolytic plating. Unless otherwise specified, steps in the second embodiment similar to steps described in the previous embodiment shall incorporate the applicable details set forth in the previously described similar steps.

In FIGS. 1-7, as previously described, adhesive chrome 30 is sputtered on Kapton 28, copper 32 is sputtered on chrome 30, Kapton 28 is disposed on substrate 20, substrate 20 is laminated, through-holes 34 are drilled in substrate 20, and palladium 38 renders through-hole sidewalls 36 catalytic.

Figure 13:
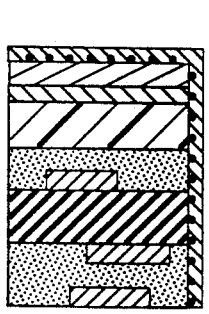
FIGS. 13-19 are fragmentary elevational views in cross-section illustrating successive stages in conjunction with FIGS. 1-7 for fabricating precision surface features on a multilayer printed circuit board using an additive process with electroless plating and electrolytic plating in accordance with a second embodiment of the present invention.
Figure 13:
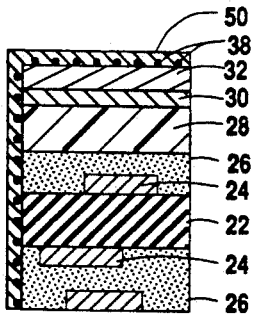

In FIG. 13, a second conductor shown as copper 50 is deposited by electroless plating on copper 32 and sidewalls 36.

Figure 14:
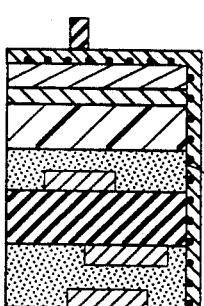
Figure 14:
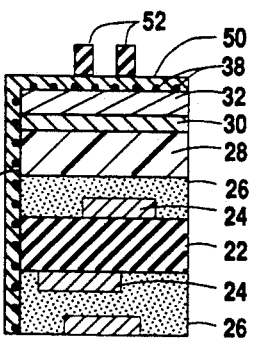

In FIG. 14, photoresist 52 is deposited on copper 50 and developed to leave portions of copper 50 exposed.

Figure 15:
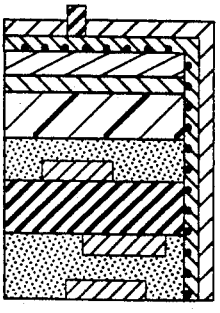
Figure 15:
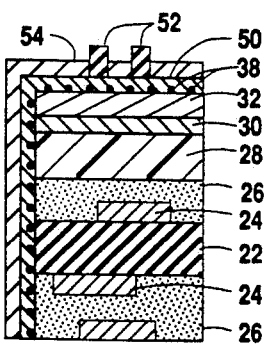

In FIG. 15, a third conductor seen as copper 54 is deposited by electrolytic plating on the exposed portions of copper 50.

Figure 16:
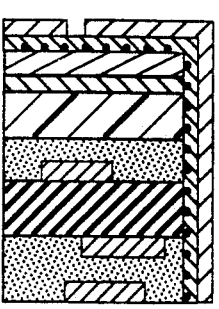
Figure 16:
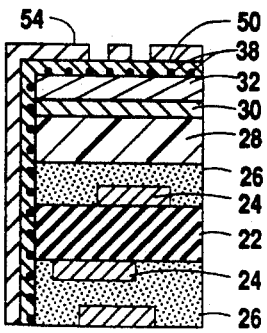

In FIG. 16, photoresist 52 is stripped, thereby exposing second portions of copper 50 which are not covered by copper 54.

Figure 17:
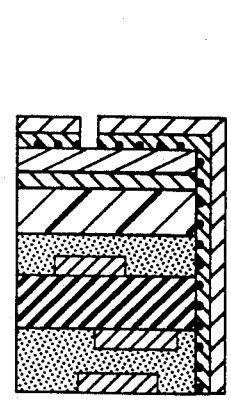
Figure 17:
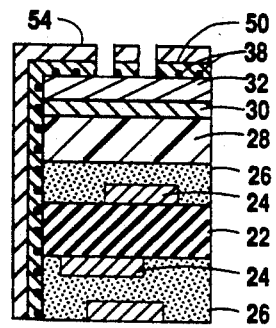

In FIG. 17, the exposed second portions of copper 50 are removed by wet chemical etching, thereby exposing portions of copper 32.

Figure 18:
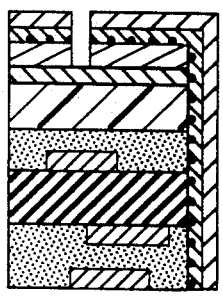
Figure 18:
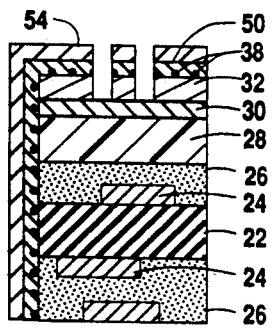

In FIG. 18, the exposed portions of copper 32 are stripped in a wet chemical etch, thereby exposing portions of chrome 30. Copper 50 and copper 32 can be removed in by the same copper etching solution if desired.

Figure 19:
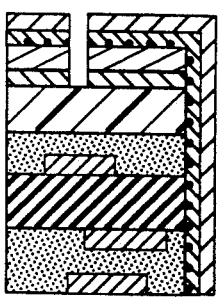
Figure 19:
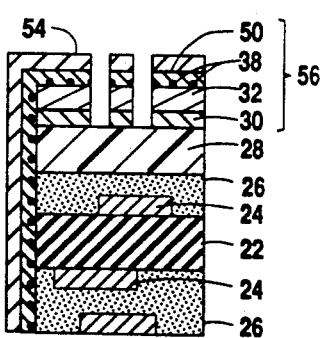

In FIG. 19, the exposed portions of chrome 30 are also stripped in a wet chemical etch, thereby providing a predetermined pattern of spaced surface features 56, comprising copper 54, copper 50, copper 32 and chrome 30, which do not suffer from significant undercut.

While the second embodiment, unlike the first embodiment, requires the use of a third conductor (copper 54) and additional electrolytic plating and wet etch steps, these may be advantageous due to the typically faster deposition rates and stronger adhesion of electrolytically plated metals as compared to electrolessly plated metals. In addition, the vacuum deposited copper 32 and palladium 38 would not constitute a preferred electrolytic plating mask due to the extreme thinness of these layers.

Third Embodiment

Referring now to FIGS. 1-7 and 20-25, there is shown a third embodiment of the present invention which forms the spaced features using a subtractive process with electroless plating. Unless otherwise specified, steps in the third embodiment similar to steps described in the previous embodiments shall incorporate the applicable details set forth in the previously described similar steps.

In FIGS. 1-7, as previously described, adhesive chrome 30 is sputtered on Kapton 28, copper 32 is sputtered on chrome 30, Kapton 28 is disposed on substrate 20, substrate 20 is laminated, through-holes 34 are drilled in substrate 20, and palladium 38 renders through-hole sidewalls 36 catalytic.

Figure 20:
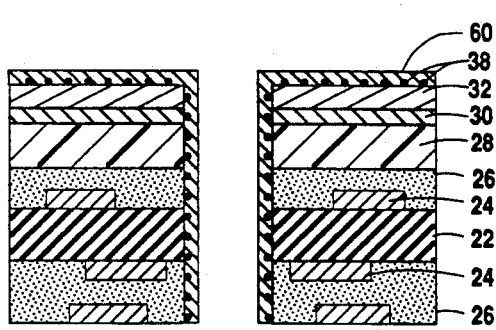
FIGS. 20-25 are fragmentary elevational views in cross-section illustrating successive stages in conjunction with FIGS. 1-7 for fabricating precision surface features on a multilayer printed circuit board using a subtractive process with electroless plating in accordance with a third embodiment of the present invention.

In FIG. 20, a second conductor shown as copper 60 is electrolessly deposited on copper 32 and sidewalls 36.

Figure 21:
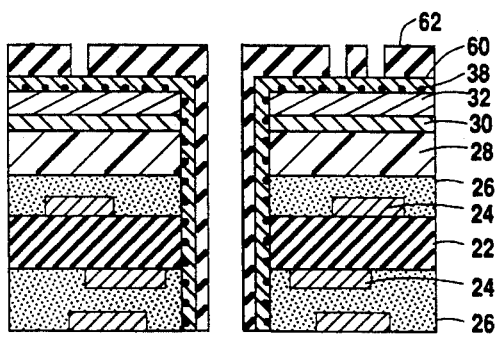

In FIG. 21, photoresist 62 is patterned on copper 60.

Figure 22:
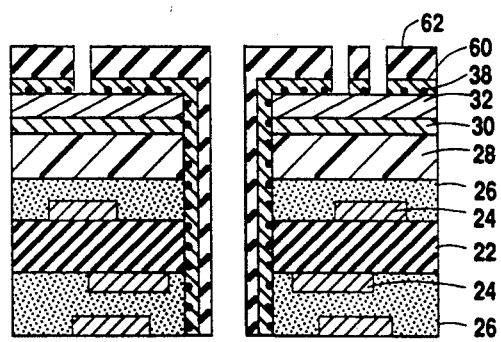

In FIG. 22, the exposed portions of copper 60 are removed in a wet chemical etch thereby exposing portions of copper 32.

Figure 23:
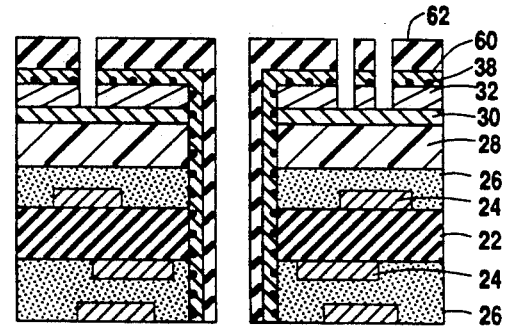

In FIG. 23, the exposed portions of copper 32 are removed in a wet chemical etch thereby exposing portions of chrome 30.

Figure 24:
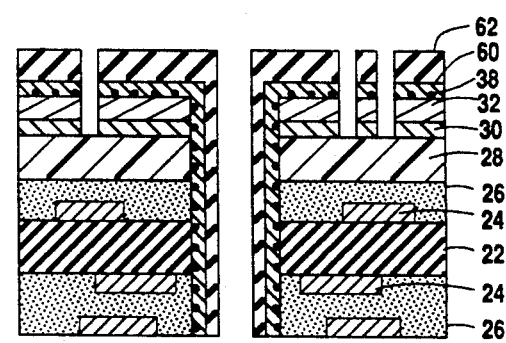

In FIG. 24, the exposed portions of chrome 30 are removed in a wet chemical etch thereby exposing portions of Kapton 28.

Figure 25:
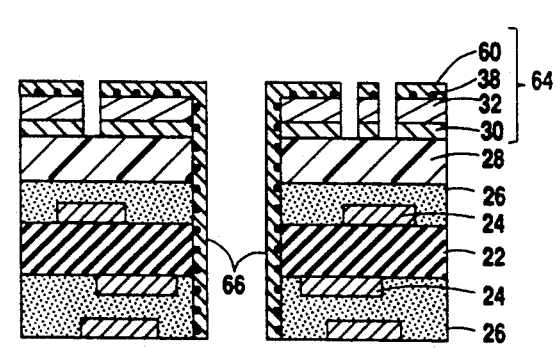

In FIG. 25, resist 62 is stripped leaving spaced features 64, comprising copper 60, copper 32 and chrome 30, on Kapton 28 and electrically connected to conductive vias 66.

Fourth Embodiment

Referring now to FIGS. 1-7 and 26-32, there is shown a fourth embodiment of the present invention which forms the spaced features using a subtractive process with electroless plating and electrolytic plating. Unless otherwise specified, steps in the fourth embodiment similar to steps described in the previous embodiments shall incorporate the applicable details set forth in the previously described similar steps.

In FIGS. 1-7, as previously described, adhesive chrome 30 is sputtered on Kapton 28, copper 32 is sputtered on chrome 30, Kapton 28 is disposed on substrate 20, substrate 20 is laminated, through-holes 34 are drilled in substrate 20, and palladium 38 renders through-hole sidewalls 36 catalytic.

In FIG. 26, a second conductor shown as copper 70 is electrolessly deposited on copper 32.

In FIG. 27, a third conductor shown as copper 72 is electrolytically deposited on copper 70.

In FIG. 28, photoresist 74 is patterned on copper 72.

In FIG. 29, the exposed copper 72 is removed by wet chemical etching thereby exposing portions of copper 70.

In FIG. 30, the exposed portions of copper 70 are removed by wet chemical etching thereby exposing portions of copper 32.

In FIG. 31, the exposed portions of copper 32 are removed by wet chemical etching thereby exposing portions of chrome 30. It is noted that copper 72, copper 70 and copper 32 can be removed in the same wet chemical etch bath.

In FIG. 32, the exposed portions of chrome 30 are removed by wet chemical etching thereby exposing portions of Kapton 28.

In FIG. 33, the photoresist 74 is stripped, leaving spaced features 76, comprising copper 72, copper 70, copper 32 and chrome 30, on Kapton 28.

The additional electrolytically deposited third layer of copper 72 provides the same advantages as those mentioned above for copper 54 in the second embodiment.

Figure 34:
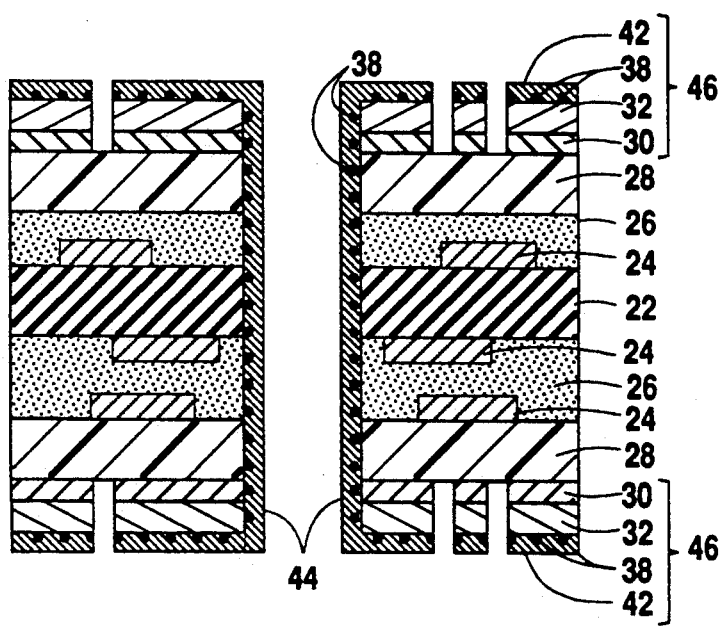
FIG. 34 is a fragmentary elevational view in cross-section showing a multilayer printed circuit board fabricated using the steps of FIGS. 1-12 applied to the top and bottom surfaces of the board.

Referring now to FIG. 34, it is seen that the fine pitch surface patterning of the present invention can be performed on both sides of the substrate if desired. For instance, referring to the first embodiment, the steps of FIGS. 1-12 may be applied to both sides of substrate 20 to produce features 46 on the top and bottom surfaces. As is seen, the conductive vias 44 provide continuous paths to electrically connect features 46 on the top surface to features 46 on the bottom surface. In addition, the steps of depositing copper 42 and forming spaced features 46 may be implemented simultaneously on the top and bottom surfaces of the substrate (i.e., copper 42 is simultaneously deposited on the top and bottom surfaces, and then features 46 are simultaneously formed on the top and bottom surfaces).

Numerous variations of the above-mentioned embodiments will be readily apparent to those skilled in the art. For instance, the first conductor and/or adhesion metal can be deposited on a dielectric base already disposed on the substrate. The doubled-sided structure shown in FIG. 12 can be fabricated using any of the embodiments herein. The third conductor can be simultaneously deposited on both sides of the substrate. Any number of wet chemical etchants are acceptable, although a reactive ion etch is not considered to be economically feasible for the present invention. Additional conductors, plating, photolithography and wet etching steps could be used to plate up additional levels of metallization. Several electroless plating steps could be employed, such as a low build electroless layer beneath a high build electroless layer. In addition, the through-holes need not necessarily extend between the top and bottom surfaces.

The noveltly of the present invention resides in disposing a thin vacuum deposited plating layer on a dielectric surface disposed on a substrate before laminating the substrate. After subsequent lamination and pattern plating the thinness of the plating layer allows it to be wet chemical etched without significantly undercutting the plated features. As such, the present invention makes use of conventional multilayer board processing steps which include sputtering, electroless plating, electrolytic plating, lamination, photolithography, through-hole drilling, wet chemical etching and the like. These steps are well understood by those skilled in the art and are further detailed, for example, in U.S. Pat. Nos. 4,431,710; 4,499,152; 4,521,280; 4,705,592; 4,812,213; 5,039,570 which are all incorporated herein by reference.

The present invention, therefore, is well adapted to carry out the objects and attain the ends and advantages mentioned, as well as others inherent therein. While presently preferred embodiments of the present invention have been described for the purpose of disclosure, numerous other changes in the details can be carried out without departing from the spirit of the present invention which is intended to be limited only by the scope of the appended claims.

What is claimed is:

1. A process for producing electrical circuits, comprising the steps of:
   providing a substrate containing a patterned conductor, a dielectric, and reflowable adhesive;
   vacuum depositing a first conductor on the top surface of a dielectric base;
   disposing said dielectric base on said substrate;
   laminating said substrate with said first conductor thereon so as to reflow said adhesive;
   forming a through-hole in the top surface of said substrate at least partially through said substrate;
   providing a plating seed on the sidewalls of said through-hole;
   depositing a conductive metal on said sidewalls;
   depositing a second conductor on said first conductor; and
   forming spaced features on said dielectric base wherein said spaced features comprise said first and second conductors and at least one of said spaced features is electrically connected to said metal in said through-hole.

2. The process of claim 1 wherein said spaced features and said metal in said through-hole are formed by the steps of:
   patterning resist on said first conductor so as to expose portions of said first conductor and said sidewalls;
   depositing said second conductor on said exposed portions of said first conductor and on said sidewalls;
   stripping said resist so as to expose second portions of said first conductor; and
   removing said exposed second portions of said first conductor.

3. The process of claim 1 wherein said spaced features and said metal in said through-hole are formed by the steps of:
   depositing said second conductor on said first conductor and on said sidewalls;
   patterning resist on said second conductor so as to expose portions of said second conductor;
   removing said exposed portions of said second conductor thereby exposing portions of said first conductor;
   removing said exposed portions of said first conductor; and
   stripping said resist.

4. The process of claim 1, further comprising depositing an adhesion metallic layer on said dielectric base and then vacuum depositing said first conductor on said adhesion metallic layer.

5. The process of claim 4 wherein said adhesion metallic layer is vacuum deposited on said dielectric base.

6. The process of claim 4 wherein said spaced features comprise said second conductor on said first conductor on said adhesion metal.

7. The process of claim 1 wherein said first conductor is less than one micron thick.

8. The process of claim 1 wherein said first conductor is between 500–2500 angstroms thick.

9. The process of claim 1 wherein said vacuum depositing step is performed by evaporating said first conductor on said dielectric base.

10. The process of claim 1 wherein said vacuum depositing step is performed by ion assisted evaporating said first conductor on said dielectric base.

11. The process of claim 1 wherein said vacuum depositing step is performed by magnetron ion plating said first conductor on said dielectric base.

12. The process of claim 1 wherein said vacuum depositing step is performed by ion enhanced plating said first conductor on said dielectric base.

13. The process of claim 1 wherein said vacuum depositing step is performed by chemical vapor depositing said first conductor on said dielectric base.

14. The process of claim 1 wherein said vacuum depositing step is performed by sputtering said first conductor on said dielectric base.

15. The process of claim 2 wherein the step of depositing said second conductor is performed by electroplating said second conductor on said exposed portions of said first conductor and on said sidewalls.

16. The process of claim 3 wherein the step of depositing said second conductor is performed by electroplating said second conductor on said first conductor and on said sidewalls.

17. The process of claim 2 wherein said removing and stripping steps are performed by wet chemical etching without significantly undercutting said spaced features.

18. The process of claim 3 wherein the removing and stripping steps are performed by wet chemical etching without significantly undercutting said spaced features.

19. The process of claim 1 wherein said dielectric base is a flexible, non-brittle material and said vacuum depositing occurs as said dielectric base is provided from a continuous roll.

20. A process for producing electrical circuits, comprising the following steps:
   providing a substrate containing layers of patterned conductors, dielectric, and reflowable adhesive;
   providing a dielectric base;
   depositing an adhesion metallic layer on said dielectric base;
   vacuum depositing a first metallic conductor less than one micron thick on said adhesion metallic layer;
   disposing said dielectric base on said substrate; then laminating said substrate so as to reflow said adhesive;
   forming a plurality of through-holes in the top of said substrate at least partially through said substrate;
   providing a plating seed for electroless plating on the sidewalls of said through-holes to render said sidewalls catalytic;
   depositing a second metallic conductor on said first conductor and on said catalytic sidewalls so as to form conductive vias in said through-holes;
   depositing a third metallic conductor on said second conductor; and
   forming spaced features comprising said third conductor on said second conductor on said first conductor on said adhesion metal wherein said conductive vias connect selected spaced features to selected patterned conductors.

21. The process of claim 20, further including the steps of:
   electroplating said second conductor on said first conductor and on said sidewalls;
   applying resist on said second conductor;
   developing said resist to create openings in said resist which expose portions of said second conductor;
   electroplating said third conductor on said exposed portions of said second conductor;
   stripping said resist thereby exposing second portions of said second conductor uncovered by said third conductor;
   removing said exposed second portions of said second conductor thereby exposing portions of said first conductor uncovered by said second and third conductors;
   removing said exposed portions of said first conductor thereby exposing portions of said adhesion metallic layer uncovered by said first, second and third conductors; and
   removing said exposed portions of said adhesion metallic layer thereby exposing portions of said dielectric base between said spaced features.

22. The process of claim 20, further including the steps of:
   electroplating said second conductor on said first conductor and on said sidewalls;
   electroplating said third conductor on said second conductor;
   applying resist on said third conductor;
   developing said resist to create openings in said resist thereby exposing portions of said third conductor;
   removing said exposed portions of said third conductor thereby exposing portions of said second conductor;
   removing said exposed portions of said second conductor thereby exposing portions of said first conductor;
   removing said exposed portions of said first conductor thereby exposing portions of said adhesion metallic layer;
   removing said exposed portions of said adhesion metallic layer thereby exposing portions of said dielectric base between said spaced features; and
   stripping said resist.

23. The process of claim 20 wherein the steps of depositing said second conductor, depositing said third conductor, and forming spaced features are simultaneously implemented on the top and bottom surfaces of said substrate.

24. The process of claim 20 wherein said adhesion metallic layer and said first conductor are vacuum deposited by sputtering.

25. The process of claim 20 wherein said reflowable adhesive is prepreg, s id dielectric and said dielectric base are polymers, said plating seed contains palladium, and said first conductor is copper.

26. The process of claim 20 wherein the step of depositing said second conductor is performed by electroplating said second conductor on said first conductor and on said sidewalls, and the step of depositing said third conductor is performed by electroplating said third conductor on said second conductor.

27. The process of claim 26 wherein said second conductor is electroplated by electroless plating.

28. The process of claim 27 wherein said third conductor is electroplated by electrolytic plating.

29. The process of claim 20 wherein the step of forming said spaced features includes wet chemical etching without significantly undercutting said spaced features.

30. The process of claim 20 wherein the step of forming said spaced features non-selective vapor honing with a slurry under pressure.

31. The process of claim 20 wherein the step of forming said spaced features includes non-selective sandblasting.

32. The process of claim 20 wherein the step of forming said spaced pads includes non-selective plasma flash etching.

33. The process of claim 20 wherein said through-holes are formed between the top and bottom surfaces of said substrate.

34. The process of claim 20 wherein said dielectric base is a flexible, non-brittle material and said vacuum depositing occurs as said dielectric base is provided from a continuous roll.

35. A process for producing a multilayer printed circuit board, comprising the following steps:
   providing a substrate containing circuit layers and reflowable prepreg layers, said circuit layers comprising patterned copper circuits and a polymer dielectric, said circuit layers separated by said prepreg layers;
   providing a dielectric base;
   depositing an adhesion metallic layer selected from the group consisting of chrome and titanium on said dielectric base;
   vacuum depositing a smooth first copper film less than one micron thick on said adhesion metallic layer;
   disposing a reflowable adhesive layer on said substrate;

disposing said dielectric base on said reflowable adhesive layer;

laminating said substrate with said copper film thereon by applying heat and pressure to said substrate thereby reflowing and hardening said prepreg and said reflowable adhesive;

drilling vertical through-holes in the top surface of said laminated substrate at least partially through said laminated substrate;

depositing a plating seed on the sidewalls of said through-holes to render said sidewalls catalytic for electroplating;

electroplating additional copper on said first copper film and on said catalytic sidewalls; and forming a predetermined pattern of plated up spaced features having a pitch of less than 6 mils comprising said adhesion metal, said first copper film and said additional copper on said dielectric base using photolithography and wet chemical etching without significantly undercutting said spaced features;

wherein said additional copper connects selected spaced features to first patterned copper circuits, and second patterned copper circuits to third patterned copper circuits.

36. The process of claim 35 wherein said spaced features are formed by the steps of:

electrolessly plating a second copper film on said first copper film and on said catalytic sidewalls;

applying photoresist on said second copper film;

developing said photoresist to create openings therethrough which expose portions of said second copper film;

electrolytically plating a third copper film at least five microns thick on said exposed portions of said second copper film;

stripping said photoresist by wet chemical etching thereby exposing second portions of said second copper film;

removing said exposed second portions of said second copper film by wet chemical etching thereby exposing portions of said first copper film;

removing said exposed portions of said first copper film by wet chemical etching thereby exposing portions of said adhesion metal; and removing said exposed portions of said adhesion metal by wet chemical etching.

37. The process of claim 35 wherein said spaced features are formed by the steps of:

electrolessly plating a second copper film on said first copper film and on said catalytic sidewalls;

electrolytically plating a third copper film at least five microns thick on said second copper film;

applying photoresist on said third copper film;

developing said photoresist to create openings therethrough which expose portions of said third copper film;

removing said exposed portions of said third copper film by wet chemical etching thereby exposing portions of said second copper film;

removing said exposed portions of said second copper film by wet chemical etching thereby exposing portions of said first copper film;

removing said exposed portions of said first copper film by wet chemical etching thereby exposing portions of said adhesion metal;

etching said exposed portions of said adhesion metallic layer; and stripping said photoresist by wet chemical etching.

38. The process of claim 35 wherein said vacuum deposition steps are performed by sputtering.

39. The process of claim 35, wherein said dielectric base is a flexible, non-brittle material;

said adhesion metallic layer is vacuum deposited on said dielectric base provided from a continuous roll; and said copper film is vacuum deposited on said adhesion metallic layer.

40. The process of claim 39 wherein said reflowable adhesive layer is a top prepreg layer above said circuit layers and disposed on said substrate prior to disposing said dielectric base on said top prepreg layer.

41. The process of claim 39 wherein said reflowable adhesive layer is attached to the side of said dielectric base opposite said adhesion metallic layer prior to disposing said reflowable adhesive layer on said substrate.

* * * * *